(12) United States Patent
Park et al.

(10) Patent No.: US 9,660,187 B1
(45) Date of Patent: May 23, 2017

(54) METHODS OF FORMING A LAYER AND METHODS OF MANUFACTURING MAGNETIC MEMORY DEVICES USING THE SAME

(71) Applicants: Yong Sung Park, Suwon-si (KR); Joonmyoung Lee, Anyang-si (KR); Ki Woong Kim, Hwaseong-si (KR); Juhyun Kim, Hwaseong-si (KR); Sechung Oh, Yongin-si (KR)

(72) Inventors: Yong Sung Park, Suwon-si (KR); Joonmyoung Lee, Anyang-si (KR); Ki Woong Kim, Hwaseong-si (KR); Juhyun Kim, Hwaseong-si (KR); Sechung Oh, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/202,250

(22) Filed: Jul. 5, 2016

(30) Foreign Application Priority Data

Oct. 29, 2015 (KR) .......................... 10-2015-0151223

(51) Int. Cl.
*H01L 21/00* (2006.01)
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
None
See application file for complete search history.

(56) References Cited

U.S. PATENT DOCUMENTS

| 6,596,133 | B1* | 7/2003 | Moslehi | C23C 14/0031 |
| | | | | 118/723 MP |
| 7,920,361 | B2 | 4/2011 | Yoshikawa et al. | |
| 8,176,622 | B2 | 5/2012 | Horng et al. | |
| 8,278,123 | B2 | 10/2012 | Choi et al. | |
| 8,456,893 | B2 | 6/2013 | Horng et al. | |
| 8,472,151 | B2 | 6/2013 | Wang et al. | |
| 8,758,850 | B2 | 6/2014 | Zhou et al. | |
| 8,981,505 | B2 | 3/2015 | Moriyama et al. | |
| 2011/0223346 | A1* | 9/2011 | Kitada | C23C 14/3464 |
| | | | | 427/523 |
| 2012/0261777 | A1* | 10/2012 | Shukh | H01L 43/08 |
| | | | | 257/421 |
| 2015/0075971 | A1* | 3/2015 | Furukawa | H01J 37/3444 |
| | | | | 204/192.15 |
| 2015/0259788 | A1* | 9/2015 | Nagamine | H01J 37/3417 |
| | | | | 204/192.2 |

FOREIGN PATENT DOCUMENTS

JP 2012-502447 1/2012
KR 1020110051225 5/2011

* cited by examiner

*Primary Examiner* — Angel Roman
(74) *Attorney, Agent, or Firm* — Myers Bigel, P.A.

(57) ABSTRACT

A method of forming a layer includes providing a first insulator and a second insulator over a lower structure, generating a first ion source and a second ion source from the first insulator and the second insulator, respectively, and forming an insulating layer on the lower structure using the first ion source and the second ion source. The first and second insulators are vertically spaced apart from the lower structure and are laterally spaced apart from each other. The first insulator and the second insulator include the same material.

20 Claims, 8 Drawing Sheets

METHODS OF FORMING A LAYER AND METHODS OF MANUFACTURING MAGNETIC MEMORY DEVICES USING THE SAME

CROSS-REFERENCE TO RELATED APPLICATION

This U.S. non-provisional patent application claims priority under 35 U.S.C. §119 to Korean Patent Application No. 10-2015-0151223, filed on Oct. 29, 2015, in the Korean Intellectual Property Office, the entire content of which is incorporated herein by reference in its entirety.

BACKGROUND

The inventive concepts relate to methods of forming a layer using a sputtering method and methods of manufacturing magnetic memory devices using the same.

High-speed and/or low power consumption electronic devices may be provided by including semiconductor memory devices therein with a high-speed characteristic and/or a low operating voltage. Accordingly, magnetic memory devices have been developed. The magnetic memory devices may have high-speed and/or non-volatile characteristics.

In general, a magnetic memory device may include a magnetic tunnel junction (MTJ) pattern. The magnetic tunnel junction pattern may include two magnetic layers and an insulating layer disposed between the two magnetic layers. A resistance value of the magnetic tunnel junction pattern may be changed depending on magnetization directions of the two magnetic layers. For example, when the magnetization directions of the two magnetic layers are anti-parallel to each other, the magnetic tunnel junction pattern may have a relatively large resistance value. When the magnetization directions of the two magnetic layers are parallel to each other, the magnetic tunnel junction pattern may have a relatively small resistance value. The magnetic memory device may read/write data using a difference between the resistance values of the magnetic tunnel junction pattern.

SUMMARY

Embodiments of the inventive concepts may provide methods of forming a layer which are capable of matching a lattice of a layer with a lattice of an underlying layer and of increasing a deposition rate of a layer.

Embodiments of the inventive concepts may also provide methods of manufacturing magnetic memory devices which are capable of being easily applied to the mass production.

Embodiments of the inventive concepts may also provide methods of manufacturing magnetic memory devices with excellent reliability.

In an aspect of the inventive concepts, a method of forming a layer may include providing a first insulator and a second insulator over a lower structure, the first and second insulators vertically spaced apart from the lower structure, the first and second insulators laterally spaced apart from each other, generating a first ion source and a second ion source from the first insulator and the second insulator, respectively, and forming an insulating layer on the lower structure using the first ion source and the second ion source. The first insulator and the second insulator may include a same material.

In some embodiments, the first and second insulators may include a metal oxide.

In some embodiments, the insulating layer may include the same material as the first and second insulators.

In some embodiments, the first insulator, the second insulator, and the insulating layer may include a metal oxide.

In some embodiments, generating the first and second ion sources and forming the insulating layer may be performed by a radio-frequency (RF) sputtering process using the first and second insulators as targets.

In some embodiments, the method may further include performing a thermal treatment process on the insulating layer.

In some embodiments, an uppermost portion of the lower structure may be a conductive layer having a crystal structure.

In some embodiments, a lattice of the insulating layer may match a lattice of the conductive layer at an interface between the conductive layer and the insulating layer.

In an aspect of the inventive concepts, a method of manufacturing a magnetic memory device may include sequentially forming a first magnetic layer, a non-magnetic layer, and a second magnetic layer on a substrate. Forming the non-magnetic layer may include performing a sputtering process using a plurality of insulators as targets. The plurality of insulators may include a same material.

In some embodiments, the plurality of insulators may include a metal oxide.

In some embodiments, the non-magnetic layer may include the same material as the plurality of insulators.

In some embodiments, the non-magnetic layer and the insulators may include a metal oxide.

In some embodiments, the sputtering process may be performed after forming the first magnetic layer and before forming the second magnetic layer. Forming the non-magnetic layer may further may include performing a thermal treatment process after performing the sputtering process and before forming the second magnetic layer.

In some embodiments, a lattice of the non-magnetic layer may match a lattice of the first magnetic layer at an interface between the non-magnetic layer and the first magnetic layer.

In some embodiments, the non-magnetic layer may be a tunnel barrier layer.

In some embodiments, one of the first and second magnetic layers may be a free layer and the other of the first and second magnetic layers may be a pinned layer.

In some embodiments, the first and second magnetic layers may have a magnetization direction substantially parallel to an interface between the non-magnetic layer and the second magnetic layer.

In some embodiments, the first and second magnetic layers may have a magnetization direction substantially perpendicular to an interface between the non-magnetic layer and the second magnetic layer.

In some embodiments, the sputtering process may be a radio-frequency (RF) sputtering process.

In some embodiments, performing the sputtering process using the plurality of insulators may include applying voltages that are equal to each other to the plurality of insulators.

In an aspect of the inventive concepts, a method of forming a magnetic tunnel junction may include forming a first magnetic layer on a substrate, positioning a first insulator a first distance above a surface of the first magnetic layer, positioning a second insulator a second distance above the surface of the first magnetic layer and spaced laterally apart from the first insulator, applying a first voltage to the first insulator and a second voltage to the second insulator, performing a sputtering process using the first insulator and the second insulator as targets to form a non-magnetic layer on the first magnetic layer, and forming a second magnetic layer on the non-magnetic layer.

In some embodiments, the non-magnetic layer formed by the sputtering process may include a portion in an amorphous state. The method may further include performing a heat treatment after performing the sputtering process and before forming the second magnetic layer. The heat treatment may crystallize the amorphous portion of the non-magnetic layer and may form a crystallized portion of the non-magnetic layer having a first lattice. The first lattice of the crystallized portion of the non-magnetic layer may match a second lattice of the first magnetic layer at an interface between the non-magnetic layer and the first magnetic layer.

In some embodiments, the first voltage and the second voltage may be AC voltages, respectively. The first and second voltages may have a same phase.

In some embodiments, the first distance and the second distance may be equal to one another.

In some embodiments, the first insulator may be inclined with respect to a top surface of the substrate at a first angle. The second insulator may be inclined with respect to the top surface of the substrate at a second angle having a magnitude that is equal to the first angle.

BRIEF DESCRIPTION OF THE DRAWINGS

The inventive concepts will become more apparent in view of the attached drawings and accompanying detailed description.

DETAILED DESCRIPTION

The inventive concepts will now be described more fully hereinafter with reference to the accompanying drawings, in which example embodiments of the inventive concepts are shown. The inventive concepts and methods of achieving them will be apparent from the following example embodiments that will be described in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concept to those skilled in the art.

As used herein, the singular terms "a," "an," and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises," "comprising," "includes," and/or "including", when used herein, specify the presence of stated features, integers, steps, operations, elements, and/or components, but do not preclude the presence or addition of one or more other features, integers, steps, operations, elements, components, and/or groups thereof.

Similarly, it will be understood that when an element such as a layer, region or substrate is referred to as being "on" another element, it can be directly on the other element or intervening elements may be present. In contrast, the term "directly" means that there are no intervening elements. Additionally, the embodiment in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes.

Example embodiments of aspects of the present inventive concepts explained and illustrated herein include their complementary counterparts. The same reference numerals or the same reference designators denote the same elements throughout the specification.

While such terms as "first," "second," etc., may be used to describe various components, such components must not be limited to the above terms. The above terms are used only to distinguish one component from another. For example, a first component discussed below could be termed a second component, and similarly, a second component may be termed a first component without departing from the teachings of this disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concepts are not limited to the described order of the operations. For example, two consecutively described processes may be performed substantially at the same time or performed in an order opposite to the described order.

Figure 1:
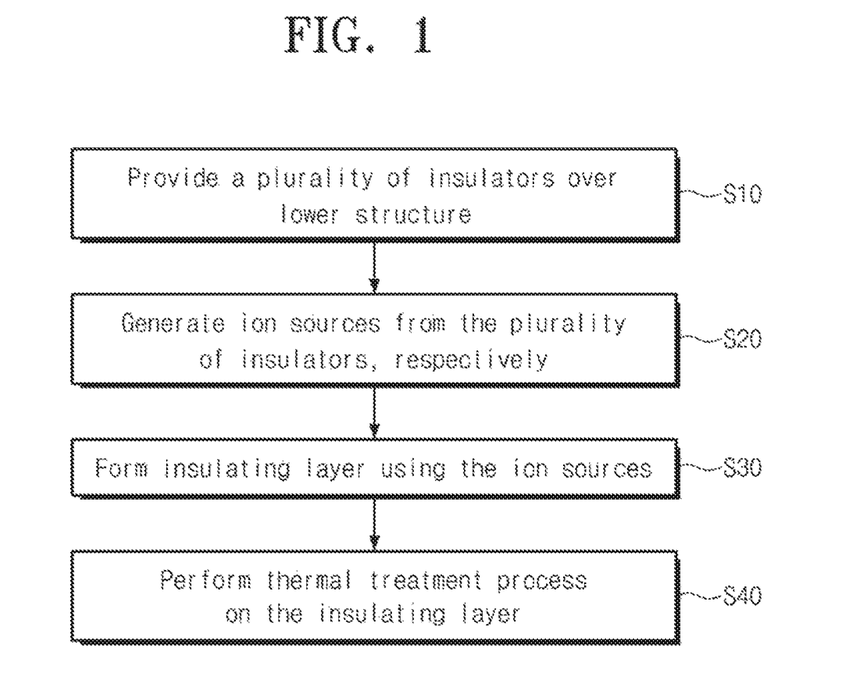
FIG. 1 is a flow chart illustrating a method of forming a layer, according to some embodiments of the inventive concepts.
Figure 2:
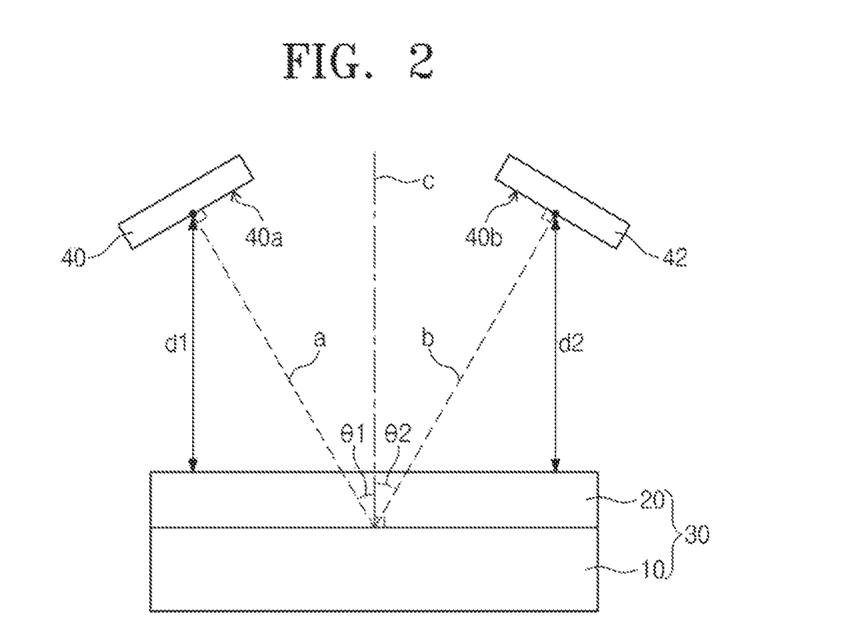
FIGS. 2 to 4 are cross-sectional views illustrating a method of forming a layer, according to some embodiments of the inventive concepts.
Figure 3:
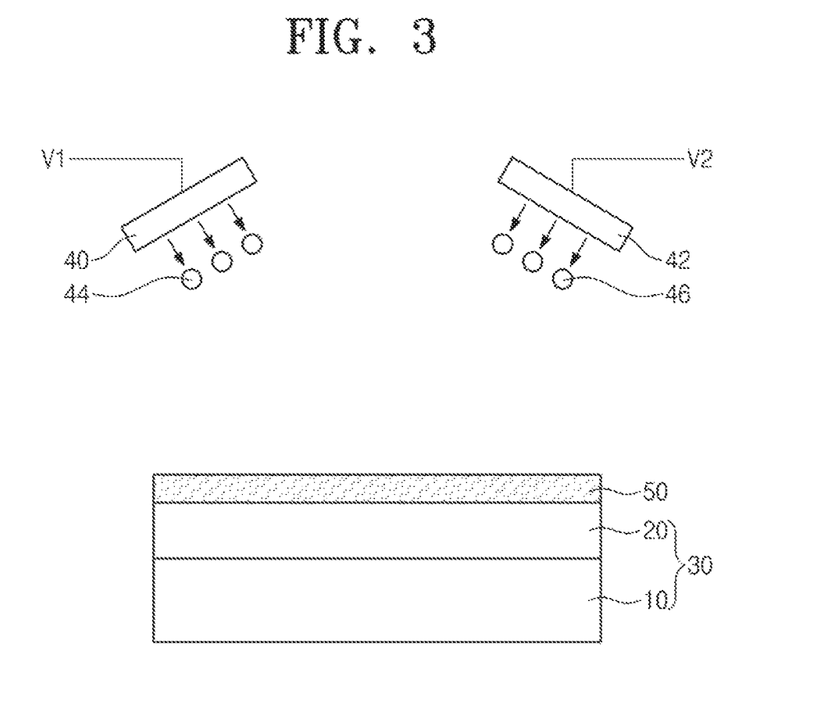
Figure 4:
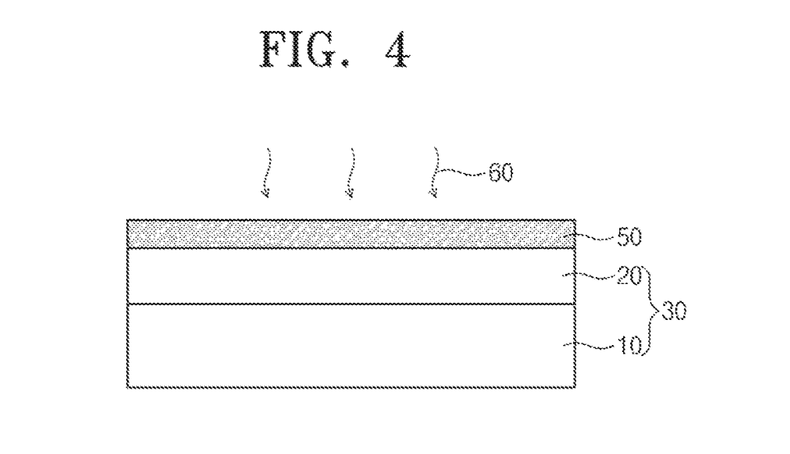

FIG. 1 is a flow chart illustrating a method of forming a layer, according to some embodiments of the inventive concepts. FIGS. 2 to 4 are cross-sectional views illustrating a method of forming a layer, according to some embodiments of the inventive concepts.

Referring to FIGS. 1 and 2, a plurality of insulators may be provided over a lower structure 30 (S10). The lower structure 30 may include a substrate 10 and a conductive layer 20 disposed on the substrate 10. The conductive layer 20 may correspond to the uppermost portion of the lower structure 30. The substrate 10 may include a selection component such as a transistor or a diode. The conductive layer 20 may include a conductive material having a crystal structure.

The plurality of insulators may include a first insulator 40 and a second insulator 42 which are laterally spaced apart from each other. In some embodiments, the first insulator 40 and the second insulator 42 may be spaced apart from each other in a direction that is parallel to the top surface of the lower structure 30. Hereinafter, the two insulators 40, 42 will be used within the description as an example for ease and convenience in explaining the inventive concepts. However, embodiments of the inventive concepts are not limited thereto. In certain embodiments, the number of the insulators may be three or more.

In some embodiments, the first insulator 40 and the second insulator 42 may be spaced apart from a top surface of the lower structure 30 by a first distance d1 and a second distance d2, respectively. The first distance d1 may be the shortest distance from the top surface of the lower structure 30 to a central point of a bottom surface 40a of the first insulator 40, and the second distance d2 may be the shortest distance from the top surface of the lower structure 30 to a central point of a bottom surface 42a of the second insulator 42. In other words, the first distance d1 may be a first perpendicular distance from the top surface of the lower structure 30 to a midpoint of the bottom surface 40a of the first insulator 40, and the second distance d2 may be a second perpendicular distance from the top surface of the lower structure 30 to a midpoint of the bottom surface 42a of the second insulator 42. In some embodiments, each of the first and second distances d1 and d2 may range from about 100 mm to about 300 mm. The first distance d1 and the second distance d2 may be substantially equal to each other.

The bottom surfaces 40a, 42a of the first and second insulators 40 and 42 may be parallel to a top surface of the substrate 10 or may be inclined with respect to the top surface of the substrate 10. In some embodiments, a normal line 'a' perpendicular to the bottom surface 40a of the first insulator 40 may form a first angle θ1 with a normal line 'c' perpendicular to the top surface of the substrate 10, and a normal line 'b' perpendicular to the bottom surface 42a of the second insulator 42 may form a second angle θ2 with the normal line 'c' perpendicular to the top surface of the substrate 10. In some embodiments, each of the first and second angles θ1 and θ2 may range from about 0 degrees to about 70 degrees. The first and second angles θ1 and θ2 may be substantially equal to each other. In some embodiments, the first and second angles θ1 and θ2 may have magnitudes substantially equal to each other while one of the angles (e.g. the first angle θ1) may be a positive angle with respect to the normal line 'c' perpendicular to the top surface of the substrate 10 and the other one of the angles (e.g. the second angle θ2) may be a negative angle with respect to the normal line 'c' perpendicular to the top surface of the substrate 10.

The first insulator 40 and the second insulator 42 may face each other over the lower structure 30. However, when the plurality of insulators includes an odd number of insulators, the insulators may not face each other.

The first insulator 40 and the second insulator 42 may include the same material. Each of the first and second insulators 40 and 42 may include a metal oxide.

Referring to FIGS. 1 and 3, an insulating layer 50 may be formed on the lower structure 30 by means of the plurality of insulators. Forming the insulating layer 50 may include performing a radio-frequency (RF) sputtering process using the plurality of insulators as targets.

In some embodiments, during the sputtering process, ion sources may be generated from the plurality of insulators (S20). The ion sources may include a first ion source 44 generated from the first insulator 40 and a second ion source 46 generated from the second insulator 42. The first ion source 44 and the second ion source 46 may include the same or similar elements. For example, the first ion source 44 and the second ion source 46 may include the same or similar metal element. Each of the first and second ion sources 44 and 46 may further include oxygen.

The first ion source 44 and the second ion source 46 may be generated by applying a first voltage V1 and a second voltage V2 to the first insulator 40 and the second insulator 42, respectively. Each of the first and second voltages V1 and V2 may be an alternating current (AC) voltage. The first and second voltages V1 and V2 may have the same or similar wave and the same or similar phase.

The insulating layer 50 may be formed on the lower structure 30 using the ion sources (S30). Ions from the first ion source 44 and the second ion source 46 may be deposited on the lower structure 30 to form the insulating layer 50.

The insulating layer 50 may include the same or similar material as the first and second insulators 40 and 42. The insulating layer 50 may include a metal oxide. After the sputtering process, at least a portion of the insulating layer 50 may be in an amorphous state.

Referring to FIGS. 1 and 4, a thermal treatment process 60 may be performed on the insulating layer 50 (S40). For example, the thermal treatment process 60 may be performed at a temperature of about 100 degrees Celsius to about 600 degrees Celsius. At least a portion of the amorphous portions of the insulating layer 50 may be crystallized by the thermal treatment process 60. Thus, a lattice of the insulating layer 50 may be matched with a lattice of the conductive layer 20 having the crystal structure at an interface between the insulating layer 50 and the conductive layer 20.

According to some embodiments of the inventive concepts, the insulating layer 50 may be formed by performing the sputtering process using as targets the plurality of insulators including the same or similar material. Thus, a deposition rate of the insulating layer 50 may be increased during the sputtering process. In some embodiments, at least a portion of the insulating layer 50 may be formed in an amorphous state. The amorphous portions in the insulating layer 50 may be crystallized by the thermal treatment process 60, and thus the lattice of the insulating layer 50 may be matched with the lattice of the conductive layer 20 at the interface between the insulating layer 50 and the conductive layer 20.

Figure 5:
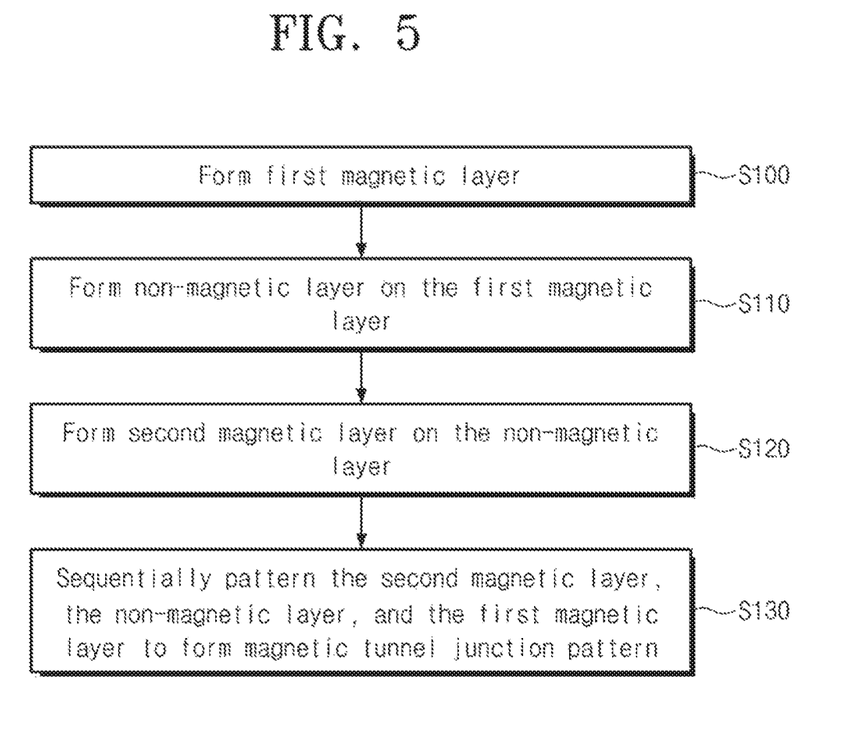
FIG. 5 is a flow chart illustrating a method of manufacturing magnetic memory devices, according to some embodiments of the inventive concepts.
Figure 6:
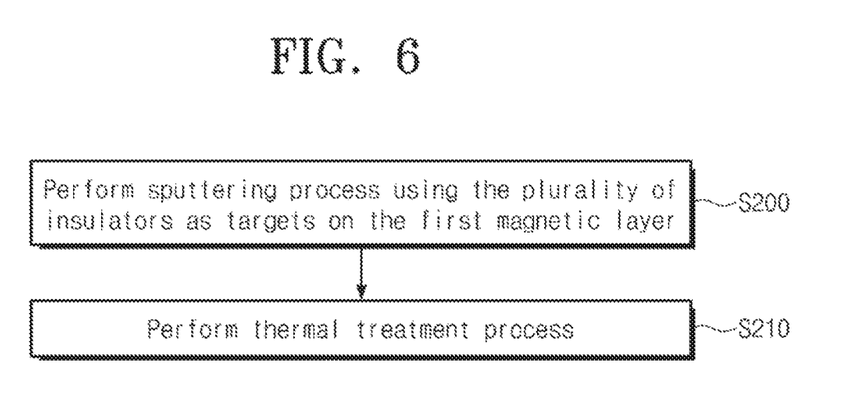
FIG. 6 is a flow chart illustrating an operation S110 of FIG. 5.
Figure 13:
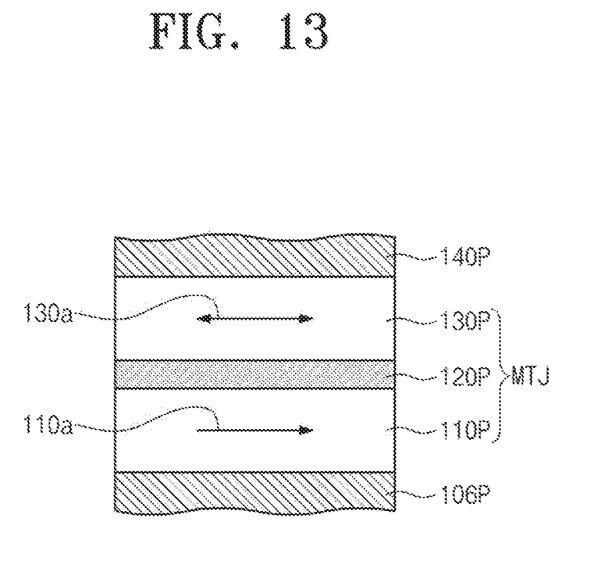
FIG. 13 is a cross-sectional view illustrating a magnetic tunnel junction pattern according to some embodiments of the inventive concepts.
Figure 14:
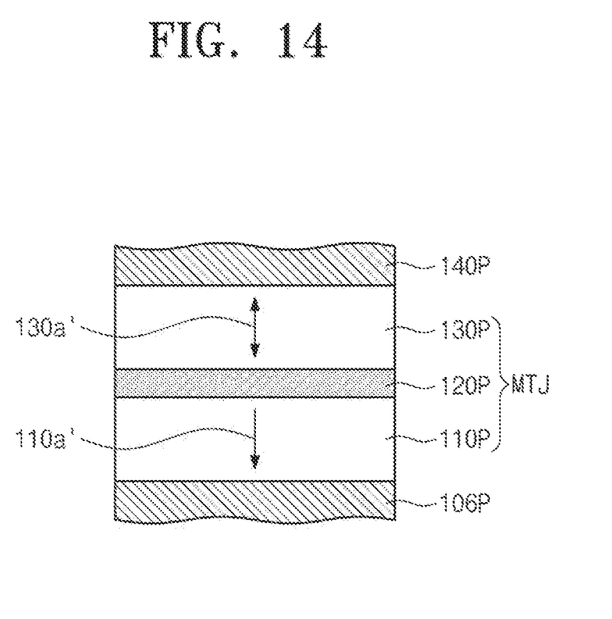
FIG. 14 is a cross-sectional view illustrating a magnetic tunnel junction pattern according to some embodiments of the inventive concepts.

FIG. 5 is a flow chart illustrating a method of manufacturing magnetic memory devices, according to some embodiments of the inventive concepts. FIG. 6 is a flow chart illustrating an operation S110 of FIG. 5. FIGS. 7 to 12 are cross-sectional views illustrating methods of manufacturing magnetic memory devices, according to some embodiments of the inventive concepts. FIG. 13 is a cross-sectional view illustrating a magnetic tunnel junction pattern according to some embodiments of the inventive concepts. FIG. 14 is a cross-sectional view illustrating a magnetic tunnel junction pattern according to some embodiments of the inventive concepts.

Figure 7:
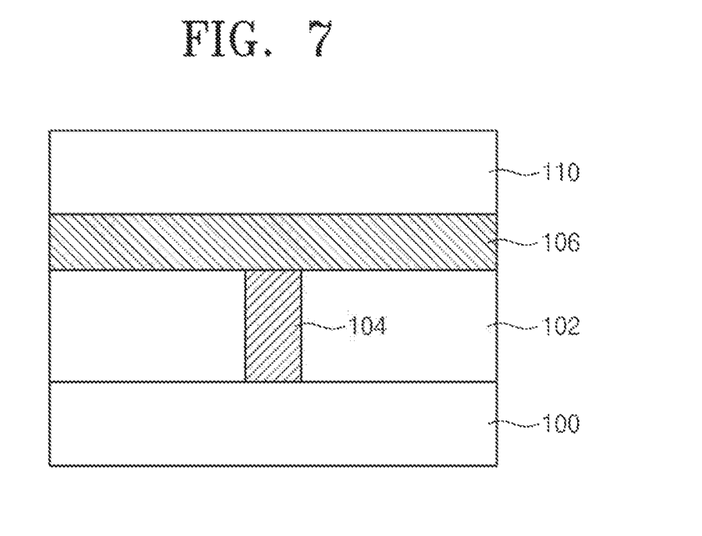
FIGS. 7 to 12 are cross-sectional views illustrating methods of manufacturing magnetic memory devices, according to some embodiments of the inventive concepts.

Referring to FIGS. 5 and 7, a lower interlayer insulating layer 102 may be formed on a substrate 100. The substrate 100 may include a semiconductor substrate. For example, the substrate 100 may include a silicon substrate, a germanium substrate, and/or a silicon-germanium substrate. In some embodiments, selection components (not shown) may be formed on the substrate 100, and the lower interlayer insulating layer 102 may be formed to cover the selection components. In some embodiments, the selection components may be field effect transistors. In some embodiments, the selection components may be diodes. The lower interlayer insulating layer 102 may be formed of a single layer or multi-layer including at least one of an oxide (e.g., silicon oxide), a nitride (e.g., silicon nitride), and/or an oxynitride (e.g., silicon oxynitride).

Lower contact plugs 104 may be formed in the lower interlayer insulating layer 102. Each of the lower contact plugs 104 may penetrate the lower interlayer insulating layer 102 so as to be connected to one terminal of a corresponding one of the selection components. The lower contact plugs 104 may include at least one of a doped semiconductor material (e.g., doped silicon), a metal (e.g., tungsten, titanium, and/or tantalum), a conductive metal nitride (e.g., titanium nitride, tantalum nitride, and/or tungsten nitride), and/or a metal-semiconductor compound (e.g., a metal silicide).

A lower electrode layer 106 may be formed on the lower interlayer insulating layer 102. In some embodiments, the lower electrode layer 106 may include a conductive metal nitride such as titanium nitride and/or tantalum nitride. In some embodiments, the lower electrode layer 106 may include a material (e.g., ruthenium (Ru)) capable of assisting crystal growth of magnetic layers to be described later. The lower electrode layer 106 may be formed by a sputtering process, a chemical vapor deposition (CVD) process, or an atomic layer deposition (ALD) process.

A first magnetic layer 110 may be formed on the lower electrode layer 106 (S100). The first magnetic layer 110 may be a pinned layer having a magnetization direction fixed in one direction or may be a free layer having a changeable magnetization direction.

In some embodiments, the magnetization direction of the first magnetic layer 110 may be substantially perpendicular to an interface between the first magnetic layer 110 and a non-magnetic layer to be formed on the first magnetic layer 110. In these embodiments, the first magnetic layer 110 may include at least one of a perpendicular magnetic material (e.g., CoFeTb, CoFeGd, and/or CoFeDy), a perpendicular magnetic material having a $L1_0$ structure, a CoPt alloy having a hexagonal close packed (HCP) lattice structure, and/or a perpendicular magnetic structure. The perpendicular magnetic material having the $L1_0$ structure may include at least one of FePt having the $L1_0$ structure, FePd having the $L1_0$ structure, CoPd having the $L1_0$ structure, and/or CoPt having the $L1_0$ structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where "n" denotes a number of bilayers.

In some embodiments, the magnetization direction of the first magnetic layer 110 may be substantially parallel to the interface between the first magnetic layer 110 and the non-magnetic layer to be formed on the first magnetic layer 110. In these embodiments, the first magnetic layer 110 may include a ferromagnetic material. When the first magnetic layer 110 is the pinned layer, the first magnetic layer 110 may further include an anti-ferromagnetic material for fixing a magnetization direction of the ferromagnetic material.

The first magnetic layer 110 may be formed by performing a physical vapor deposition (PVD) process or a CVD process.

Figure 10:
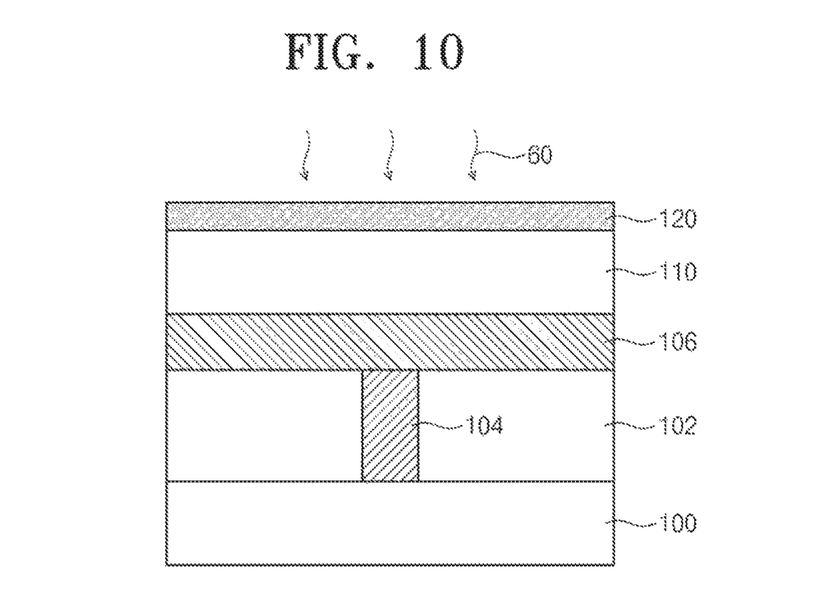

Referring to FIGS. 5 and 10, a non-magnetic layer 120 may be formed on the first magnetic layer 110 (S110). The non-magnetic layer 120 may be a tunnel barrier layer.

Figure 8:
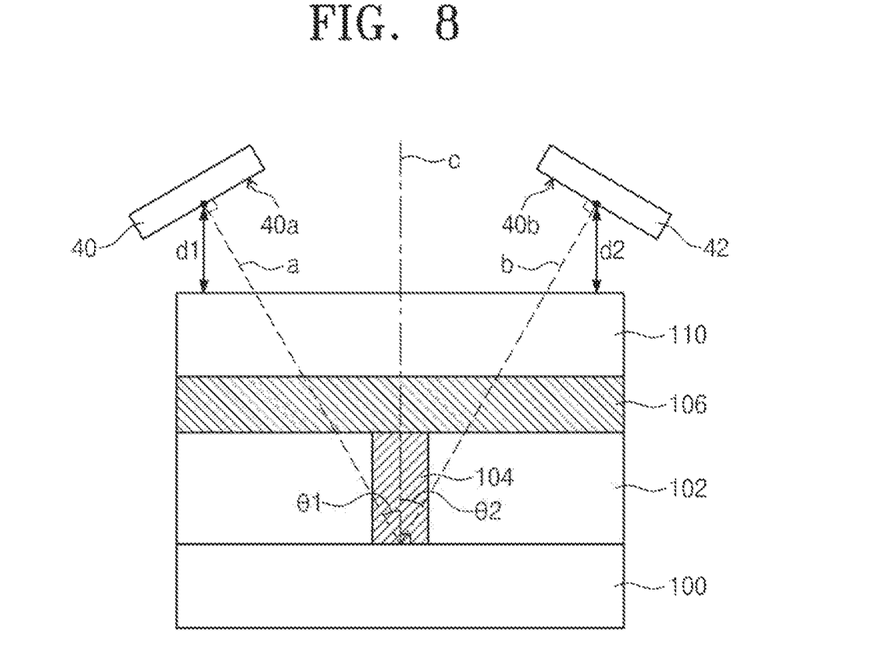

In detail, referring to FIG. 8, a plurality of insulators may be provided over the substrate 100 having the first magnetic layer 110. The plurality of insulators may include a first insulator 40 and a second insulator 42 laterally spaced apart from each other. In some embodiments, the first insulator 40 and the second insulator 42 may be spaced apart from each other in a direction that is parallel to the top surface of the first magnetic layer 110. The first insulator 40 and the second insulator 42 may be spaced apart from a top surface of the first magnetic layer 110 by a first distance d1 and a second distance d2, respectively. The first distance d1 may be the shortest distance from the top surface of the first magnetic layer 110 to a central point of a bottom surface 40a of the first insulator 40, and the second distance d2 may be the shortest distance from the top surface of the first magnetic layer 110 to a central point of a bottom surface 42a of the second insulator 42. In other words, the first distance d1 may be a first perpendicular distance from the top surface of the first magnetic layer 110 to a midpoint of the bottom surface 40a of the first insulator 40, and the second distance d2 may be a second perpendicular distance from the top surface of the first magnetic layer 110 to a midpoint of the bottom surface 42a of the second insulator 42. In some embodiments, each of the first and second distances d1 and d2 may range from about 100 mm to about 300 mm. The first distance d1 and the second distance d2 may be substantially equal to each other.

The bottom surfaces 40a, 42a of the first and second insulators 40 and 42 may be parallel to a top surface of the substrate 100 or may be inclined with respect to the top surface of the substrate 100. In some embodiments, a normal line 'a' perpendicular to the bottom surface 40a of the first insulator 40 may form a first angle θ1 with a normal line 'c' perpendicular to the top surface of the substrate 100, and a normal line 'b' perpendicular to the bottom surface 42a of the second insulator 42 may form a second angle θ2 with the normal line 'c' perpendicular to the top surface of the substrate 100. In some embodiments, each of the first and second angles θ1 and θ2 may range from about 0 degrees to about 70 degrees. The first and second angles θ1 and θ2 may be substantially equal to each other.

The first insulator 40 and the second insulator 42 may face each other over the substrate 100 having the first magnetic layer 110. However, when the plurality of insulators includes an odd number of insulators, the insulators may not face each other.

The first insulator 40 and the second insulator 42 may include the same or similar material. Each of the first and second insulators 40 and 42 may include a metal oxide. For example, each of the first and second insulators 40 and 42 may include at least one of magnesium oxide (MgO), titanium oxide (TiO), aluminum oxide (AlO), magnesium-zinc oxide (MgZnO), and/or magnesium-boron oxide (MgBO).

Figure 9:
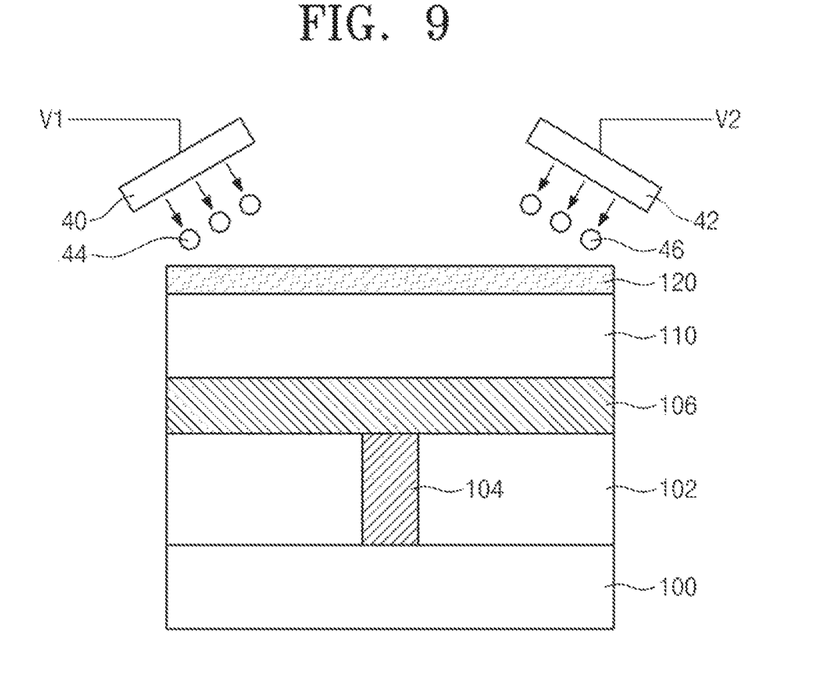

Referring to FIGS. 6 and 9, a sputtering process using the plurality of insulators as targets may be performed on the first magnetic layer 110 (S200). The sputtering process of the operation S200 may be a radio-frequency (RF) sputtering process.

Ion sources may be generated from the plurality of insulators during the sputtering process. The ion sources may include a first ion source 44 generated from the first insulator 40 and a second ion source 46 generated from the second insulator 42. The first ion source 44 and the second ion source 46 may include the same or similar elements. For example, the first ion source 44 and the second ion source 46 may include the same or similar metal element, and each of the first and second ion sources 44 and 46 may further include oxygen.

The first ion source 44 and the second ion source 46 may be generated by applying a first voltage V1 and a second voltage V2 to the first insulator 40 and the second insulator 42, respectively. Each of the first and second voltages V1 and V2 may be an AC voltage. The first and second voltages V1 and V2 may have the same or similar wave and the same or similar phase.

Ions from the first ion source 44 and the second ion source 46 may be deposited on the first magnetic layer 110 to form the non-magnetic layer 120.

The non-magnetic layer 120 may include the same or similar material as the first and second insulators 40 and 42. The non-magnetic layer 120 may include a metal oxide. For example, the non-magnetic layer 120 may include at least one of magnesium oxide (MgO), titanium oxide (TiO), aluminum oxide (AlO), magnesium-zinc oxide (MgZnO), and/or magnesium-boron oxide (MgBO). After the sputtering process, at least a portion of the non-magnetic layer 120 may be in an amorphous state.

Referring to FIGS. 6 and 10, a thermal treatment process 60 may be performed on the deposited non-magnetic layer 120 (S210). For example, the thermal treatment process 60 may be performed at a temperature of about 100 degrees Celsius to about 600 degrees Celsius. At least a portion of the amorphous portion of the non-magnetic layer 120 may be crystallized by the thermal treatment process 60. Thus, a lattice of the non-magnetic layer 120 may be matched with a lattice of the first magnetic layer 110 at an interface between the first magnetic layer 110 and the non-magnetic layer 120.

In general, a magnetic memory device may include a magnetic tunnel junction pattern including a free layer, a tunnel barrier, and a pinned layer sequentially stacked on a substrate. Forming the magnetic tunnel junction pattern may include sequentially depositing the free layer, the tunnel barrier, and the pinned layer on a substrate to form a magnetic tunnel junction layer, and patterning the magnetic tunnel junction layer. The tunnel barrier may be formed by a sputtering process having a low deposition rate such that a lattice of the tunnel barrier is matched with a lattice of the free layer (or the pinned layer) formed under the tunnel barrier at an interface between the tunnel barrier and the free layer (or the pinned layer). When using a sputtering process having a low deposition rate, a tunneling magnetoresistance ratio (TMR) of the magnetic tunnel junction pattern may be increased, but productivity of manufacturing the magnetic memory devices may be reduced by the sputtering process having the low deposition rate. In other words, it may be difficult to apply the sputtering process having the low deposition rate to the mass production of magnetic memory devices.

However, according to some embodiments of the inventive concepts, the non-magnetic layer 120 may be formed by performing the sputtering process using as targets the plurality of insulators including the same or similar material. Thus, a deposition rate of the non-magnetic layer 120 may be increased during the sputtering process. In these embodiments, at least a portion of the non-magnetic layer 120 may be formed in an amorphous state. In some embodiments, the amorphous portions of the non-magnetic layer 120 may be crystallized by the thermal treatment process 60. Thus, the lattices of the non-magnetic layer 120 and the first magnetic layer 110 may be matched with each other at the interface between the non-magnetic layer 120 and the first magnetic layer 110. In other words, a tunneling magnetoresistance ratio (TMR) of a magnetic tunnel junction pattern to be described later may be increased by the lattice matching at the interface between the non-magnetic layer 120 and the first magnetic layer 110, and productivity of manufacturing the magnetic memory devices may be improved by the sputtering process with an increased deposition rate. In other words, the embodiments of the inventive concepts may be easily applied to the mass production of the magnetic memory devices.

Figure 11:
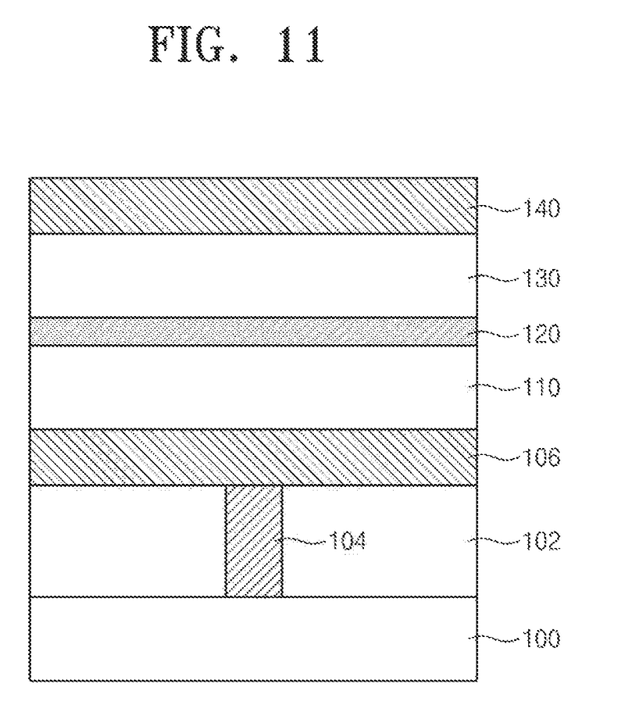

Referring to FIGS. 5 and 11, a second magnetic layer 130 may be formed on the non-magnetic layer 120 (S120). The second magnetic layer 130 may be a pinned layer having a magnetization direction fixed in one direction or may be a free layer having a changeable magnetization direction. In some embodiments, one of the first and second magnetic layers 110 and 130 may correspond to the pinned layer having the magnetization direction fixed in one direction, and the other of the first and second magnetic layers 110 and 130 may correspond to the free layer having the magnetization direction changeable to be parallel or anti-parallel to the fixed magnetization direction of the pinned layer.

In some embodiments, the magnetization direction of the second magnetic layer 130 may be substantially perpendicular to an interface between the non-magnetic layer 120 and the second magnetic layer 130. In these embodiments, the second magnetic layer 130 may include at least one of a perpendicular magnetic material (e.g., CoFeTb, CoFeGd, and/or CoFeDy), a perpendicular magnetic material having a $L1_0$ structure, a CoPt alloy having a hexagonal close packed (HCP) lattice structure, and/or a perpendicular magnetic structure. The perpendicular magnetic material having the $L1_0$ structure may include at least one of FePt having the $L1_0$ structure, FePd having the $L1_0$ structure, CoPd having the $L1_0$ structure, and/or CoPt having the $L1_0$ structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where "n" denotes a number of bilayers.

In some embodiments, the magnetization direction of the second magnetic layer 130 may be substantially parallel to the interface between the non-magnetic layer 120 and the second magnetic layer 130. In these embodiments, the second magnetic layer 130 may include a ferromagnetic material. When the second magnetic layer 130 is the pinned layer, the second magnetic layer 130 may further include an anti-ferromagnetic material for fixing a magnetization direction of the ferromagnetic material.

The second magnetic layer 130 may be formed by performing a PVD process or a CVD process.

Thereafter, an upper electrode layer 140 may be formed on the second magnetic layer 130. The upper electrode layer 140 may include at least one selected from a group consisting of tungsten, titanium, tantalum, aluminum, and/or metal nitrides (e.g., titanium nitride and/or tantalum nitride). The upper electrode layer 140 may be formed by a sputtering process, a CVD process, or an ALD process.

Figure 12:
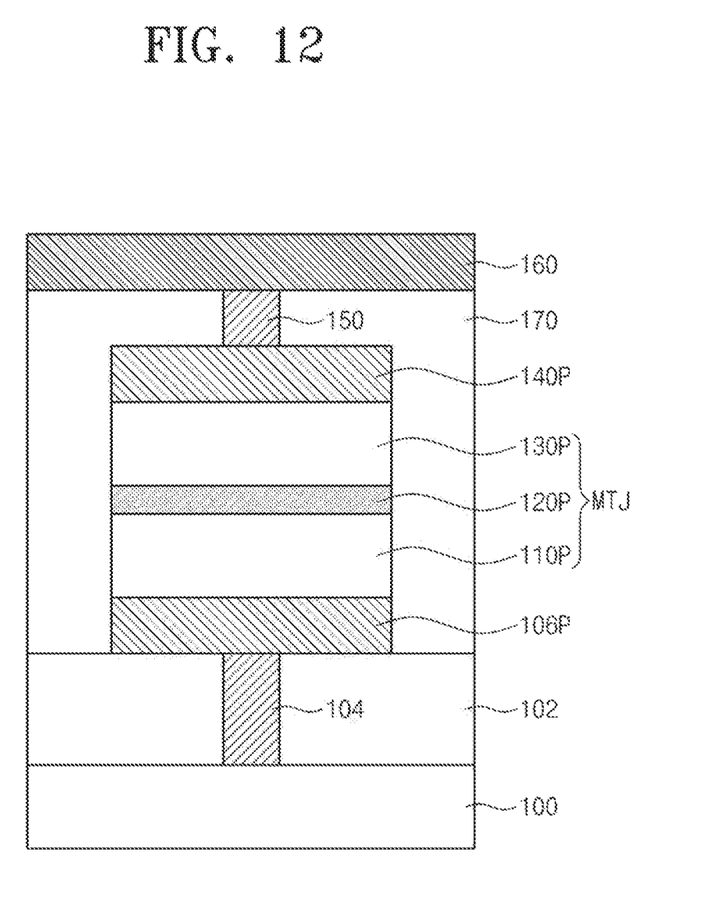

Referring to FIGS. 5 and 12, the second magnetic layer 130, the non-magnetic layer 120, and the first magnetic layer 110 may be sequentially patterned to form a magnetic tunnel junction pattern MTJ (S130). In some embodiments, the upper electrode layer 140 may be patterned to form an upper electrode 140P. The upper electrode 140P may define a region in which the magnetic tunnel junction pattern MTJ will be formed. The second magnetic layer 130, the non-magnetic layer 120, the first magnetic layer 110, and the lower electrode layer 106 may be sequentially etched using the upper electrode 140P as an etch mask to form a second magnetic pattern 130P, a non-magnetic pattern 120P, a first magnetic pattern 110P, and a lower electrode 106P. The magnetic tunnel junction pattern MTJ may include the first magnetic pattern 110P, the non-magnetic pattern 120P and the second magnetic pattern 130P which are sequentially stacked on the lower electrode 106P.

Each of the upper electrode 140P, the magnetic tunnel junction pattern MTJ and the lower electrode 106P may be formed in plurality. The plurality of lower electrodes 106P may be electrically connected to the plurality of lower contact plugs 104 formed in the lower interlayer insulating layer 102, respectively. The plurality of magnetic tunnel junction patterns MTJ may be formed on the plurality of lower electrodes 106P, respectively. The plurality of upper electrodes 140P may be formed on the plurality of magnetic tunnel junction patterns MTJ, respectively. Each of the magnetic tunnel junction patterns MTJ may include the first magnetic pattern 110P, the non-magnetic pattern 120P and the second magnetic pattern 130P which are sequentially stacked on each of the lower electrodes 106P.

In some embodiments, as illustrated in FIG. 13, magnetization directions 110a and 130a of the first and second magnetic patterns 110P and 130P may be substantially parallel to a contact surface of the non-magnetic pattern 120P and the second magnetic pattern 130P. FIG. 13 illustrates an embodiment in which the first magnetic pattern 110P is the pinned layer and the second magnetic pattern 130P is the free layer. However, embodiments of the inventive concepts are not limited thereto. Unlike FIG. 13, the first magnetic pattern 110P may be the free layer and the second magnetic pattern 130P may be the pinned layer.

Each of the first and second magnetic patterns 110P and 130P having the parallel magnetization directions 110a and 130a may include a ferromagnetic material. The first magnetic pattern 110P may further include an anti-ferromagnetic material for fixing a magnetization direction of the ferromagnetic material included in the first magnetic pattern 110P.

In some embodiments, as illustrated in FIG. 14, magnetization directions 110a' and 130a' of the first and second magnetic patterns 110P and 130P may be substantially perpendicular to the contact surface between the non-magnetic pattern 120P and the second magnetic pattern 130P. FIG. 14 illustrates an embodiment in which the first magnetic pattern 110P is the pinned layer and the second magnetic pattern 130P is the free layer. However, embodiments of the inventive concepts are not limited thereto. Unlike FIG. 14, the first magnetic pattern 110P may be the free layer and the second magnetic pattern 130P may be the pinned layer.

Each of the first and second magnetic patterns 110P and 130P having the perpendicular magnetization directions 110a' and 130a' may include at least one of a perpendicular magnetic material (e.g., CoFeTb, CoFeGd, and/or CoFeDy), a perpendicular magnetic material having a $L1_0$ structure, a CoPt alloy having a hexagonal close packed (HCP) lattice structure, and/or a perpendicular magnetic structure. The perpendicular magnetic material having the $L1_0$ structure may include at least one of FePt having the $L1_0$ structure, FePd having the $L1_0$ structure, CoPd having the $L1_0$ structure, and/or CoPt having the $L1_0$ structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and/or (CoCr/Pd)n, where "n" denotes a number of bilayers.

Referring again to FIG. 12, an upper interlayer insulating layer 170 may be formed on the lower interlayer insulating layer 102. The upper interlayer insulating layer 170 may cover the lower electrode 106P, the magnetic tunnel junction pattern MTJ, and the upper electrode 140P. The upper interlayer insulating layer 170 may be a single layer or a multi-layer. For example, the upper interlayer insulating layer 170 may include at least one of an oxide layer (e.g., a silicon oxide layer), a nitride layer (e.g., a silicon nitride layer), and/or an oxynitride layer (e.g., silicon oxynitride layer).

An upper contact plug 150 may be formed in the upper interlayer insulating layer 170. The upper contact plug 150 may be connected to the upper electrode 140P. In some embodiments, forming the upper contact plug 150 may include forming a contact hole exposing the upper electrode 140P in the upper interlayer insulating layer 170, and forming the upper contact plug 150 in the contact hole.

An interconnection 160 may be formed on the upper interlayer insulating layer 170. The interconnection 160 may extend in one direction and may be electrically connected to a plurality of the magnetic tunnel junction patterns MTJ arranged in the one direction. The magnetic tunnel junction patterns MTJ may be electrically connected to the interconnection 160 through a corresponding one of the upper electrodes 140P and the upper contact plug 150 connected to the corresponding upper electrode 140P. In some embodiments, the interconnection 160 may function as a bit line.

According to some embodiments of the inventive concepts, the non-magnetic layer may be formed by performing the sputtering process using the plurality of insulators including the same or similar material as the targets. Thus, the deposition rate of the non-magnetic layer may be increased during the sputtering process. In some embodiments, at least a portion of the non-magnetic layer may be formed in an amorphous state. In some embodiments, the amorphous portions of the non-magnetic layer may be crystallized by the thermal treatment process. Thus, the lattice of the non-magnetic layer may be matched with the lattice of the magnetic layer disposed under the non-magnetic layer at the interface between the non-magnetic layer and the magnetic layer. In other words, the TMR of the magnetic tunnel junction pattern including the non-magnetic layer and the magnetic layer may be increased by the lattice matching at the interface between the non-magnetic layer and the magnetic layer, and the productivity of manufacturing the magnetic memory devices may be improved by the sputtering process of which the deposition rate is increased. In other words, the embodiments of the inventive concepts may be easily applied to the mass production of the magnetic memory devices.

As a result, the mass production of magnetic memory devices with excellent reliability may be possible.

According to some embodiments of the inventive concepts, the lattice of a layer may be matched with the lattice of the underlying layer, and the deposition rate of the layer may be increased.

When the tunnel barrier layer of the magnetic tunnel junction pattern is formed by methods of forming layers according to some embodiments of the inventive concepts, the mass production of magnetic memory devices with excellent reliability may be possible.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts are to be determined by the broadest permissible interpretation of the following claims and their equivalents, and shall not be restricted or limited by the foregoing description.

What is claimed is:

1. A method of forming a layer, the method comprising:
   providing a first insulator and a second insulator over a lower structure, the first and second insulators vertically spaced apart from the lower structure, and the first and second insulators laterally spaced apart from each other, wherein an uppermost portion of the lower structure is a conductive layer having a crystal structure;
   generating a first ion source and a second ion source from the first insulator and the second insulator, respectively;
   forming an insulating layer on the lower structure using the first ion source and the second ion source, wherein at least a portion of the insulating layer is in an amorphous state; and
   performing a thermal treatment process on the insulating layer,
   wherein the thermal treatment process crystallizes the portion of the insulating layer in the amorphous state to match a lattice of the crystal structure of the conductive layer, and
   wherein the first insulator and the second insulator comprise the same material as each other.

2. The method of claim 1, wherein the first and second insulators comprise a metal oxide.

3. The method of claim 1, wherein the insulating layer, comprises the same material as the first and second insulators.

4. The method of claim 1, wherein generating the first and second ion sources and forming the insulating layer are performed by a radio-frequency (RF) sputtering process using the first and second insulators as targets.

5. The method of claim 1, wherein a lattice of the insulating layer matches a lattice of the conductive layer at an interface between the conductive layer and the insulating layer.

6. A method of manufacturing a magnetic memory device, the method comprising:
   sequentially forming a first magnetic layer having a crystal structure, a non-magnetic layer, and a second magnetic layer on a substrate,
   wherein forming the non-magnetic layer comprises performing a sputtering process using a plurality of insulators as targets and performing a thermal treatment process after performing the sputtering process and before forming the second magnetic layer, and
   wherein the plurality of insulators comprise the same material as each other.

7. The method of claim 6, wherein the non-magnetic layer comprises the same material as the plurality of insulators.

8. The method of claim 7, wherein the non-magnetic layer and the insulators comprise a metal oxide.

9. The method of claim 6, wherein the sputtering process is performed after forming the first magnetic layer and before forming the second magnetic layer.

10. The method of claim 9, wherein a lattice of the non-magnetic layer matches a lattice of the first magnetic layer at an interface between the non-magnetic layer and the first magnetic layer.

11. The method of claim 6, wherein one of the first and second magnetic layers is a free layer and the other of the first and second magnetic layers is a pinned layer.

12. The method of claim 11, wherein the first and second magnetic layers have a magnetization direction substantially parallel to an interface between the non-magnetic layer and the second magnetic layer.

13. The method of claim 11, wherein the first and second magnetic layers have a magnetization direction substantially perpendicular to an interface between the non-magnetic layer and the second magnetic layer.

14. The method of claim 6, wherein performing the sputtering process using the plurality of insulators comprises applying voltages that are equal to each other to the plurality of insulators.

15. A method of forming, a magnetic tunnel junction, the method comprising:
   forming a first magnetic layer having a crystal structure on a substrate;
   positioning a first insulator a first distance above a surface of the first magnetic layer;
   positioning a second insulator a second distance above the surface of the first magnetic layer and spaced laterally apart from the first insulator;
   applying a first voltage to the first insulator and a second voltage to the second insulator;
   performing a sputtering process using the first insulator and the second insulator as targets to form a non-magnetic layer on the first magnetic layer having the crystal structure; and
   forming a second magnetic layer on the non-magnetic layer,
   wherein the non-magnetic layer formed by the sputtering process comprises a portion in an amorphous state, and
   wherein the method further comprises performing a heat treatment after performing the sputtering process and before forming the second magnetic layer,
   wherein the heat treatment crystallizes the amorphous portion of the non-magnetic layer and forms a crystallized portion of the non-magnetic layer having a first lattice that matches a second lattice of the first magnetic layer at an interface between the non-magnetic layer and the first magnetic layer.

16. The method of claim 15, wherein the first voltage and the second voltage are AC voltages, respectively, and
wherein the first and second voltages have a same phase.

17. The method of claim 15, wherein the first distance and the second distance are equal to one another.

18. The method of claim 15, wherein the first insulator is inclined with respect to a top surface of the substrate at a first angle, and
wherein the second insulator is inclined with respect to the top surface of the substrate at a second angle having a magnitude that is equal to the first angle.

19. The method of claim 1, wherein the thermal treatment process is performed at a temperature of about 100 degrees Celsius to about 600 degrees Celsius.

20. The method of claim 1, wherein the conductive layer having the crystal structure is a first magnetic layer, and further comprising
forming a second magnetic layer on the insulating layer after performing the thermal treatment process.

* * * * *